US009673226B2

(12) United States Patent
Li

(10) Patent No.: US 9,673,226 B2
(45) Date of Patent: Jun. 6, 2017

(54) THIN FILM TRANSISTOR ARRAY SUBSTRATE, DISPLAY PANEL AND DISPLAY DEVICE

(71) Applicants: XIAMEN TIANMA MICRO-ELECTRONICS CO., LTD., Xiamen (CN); TIANMA MICRO-ELECTRONICS CO., LTD., Shenzhen (CN)

(72) Inventor: Weiping Li, Xiamen (CN)

(73) Assignees: XIAMEN TIANMA MICRO-ELECTRONICS CO., LTD., Xiamen (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/731,427

(22) Filed: Jun. 5, 2015

(65) Prior Publication Data

US 2015/0357348 A1    Dec. 10, 2015

(30) Foreign Application Priority Data

Jun. 5, 2014    (CN) .......................... 2014 1 0246489

(51) Int. Cl.
*H01L 27/14*    (2006.01)
*H01L 27/12*    (2006.01)
*H01L 29/786*    (2006.01)

(52) U.S. Cl.
CPC ........ *H01L 27/124* (2013.01); *H01L 27/1248* (2013.01); *H01L 29/7869* (2013.01); *H01L 29/78663* (2013.01); *H01L 29/78672* (2013.01)

(58) Field of Classification Search
CPC ...................... H01L 27/1214; H01L 29/66757
USPC .............................. 257/59, 72, 432
See application file for complete search history.

(56) References Cited

U.S. PATENT DOCUMENTS

| | | | |
|---|---|---|---|
| 2006/0132667 A1* | 6/2006 | Matsuzaki | G02F 1/136209 349/44 |
| 2014/0160416 A1* | 6/2014 | Wang | G02F 1/134363 349/139 |
| 2014/0347589 A1* | 11/2014 | Kim | G02F 1/136286 349/43 |

FOREIGN PATENT DOCUMENTS

KR    20130067915 A    6/2013

* cited by examiner

*Primary Examiner* — Tan N Tran
(74) *Attorney, Agent, or Firm* — Kilpatrick Townsend & Stockton LLP

(57) ABSTRACT

A thin film transistor array substrate for a display device generally includes: a substrate; a plurality of gate lines and a plurality of data lines arranged on the substrate intersecting with and insulated from each other; and a plurality of pixel elements arranged in areas defined by the gate lines and the data lines. At least one of the pixel elements includes: a switch element; an insulation layer located on the switch element; and a pixel electrode located at the insulation layer. The insulation layers of the pixel elements define a plurality of vias. The pixel electrodes of two adjacent pixel elements are electrically coupled with the corresponding switch elements of the two adjacent pixel elements through a common via defined by the insulation layers of the two adjacent pixel elements. The two adjacent pixel elements are disposed along extensions of the plurality of gate lines.

4 Claims, 18 Drawing Sheets

US 9,673,226 B2

THIN FILM TRANSISTOR ARRAY SUBSTRATE, DISPLAY PANEL AND DISPLAY DEVICE

CROSS-REFERENCES TO RELATED DISCLOSURES

This disclosure claims the benefit of Chinese Patent Disclosure No. 201410246489.0, filed with the Chinese Patent Office on Jun. 5, 2014 and entitled "Thin Film Transistor Array Substrate, Display Panel And Display Device", which is herein incorporated by reference in its entirety for all purposes.

BACKGROUND

In existing Liquid Crystal Display (LCD) pixel structures, particularly for pixel structures in In-Plane Switching (IPS) and Fringe Field Switching (FFS) modes, a planarization (PLN) layer will be formed before pixel electrodes are formed in order to make an electric field horizontally uniform. Furthermore, uniformly distributed vias 101 are formed in the PLN layer (as illustrated in a first scenario in FIG. 1), where the vias 101 are positioned above Thin Film Transistors (TFTs) to connect pixel electrodes of pixel elements, where the vias are positioned, with the drains of the TFTs. Particularly Photoresist Spacer (PS) 102 are positioned at locations between any two specified adjacent vias above the PLN layer to support an upper substrate, so that the cell thickness between the upper substrate and a lower substrate is maintained uniform to thereby ensure surface pressure capabilities.

In order to improve the density of display pixels of the LCD while decreasing the size of respective sub-pixels, the original size of the PLN vias has to be maintained due to a process restriction, in this way resulting in a shorter distance between the adjacent PLN vias, so that there may be an arc occurring at the support locations where the photoresist spacers are positioned, and the photoresist spacers can not come into full contact with the lower substrate; and the photoresist spacers tend to slip into the PLN vias in the case of poor bonding in a vacuum, in this way lowering the cell thickness at the locations where the photoresist spacers are positioned; and moreover the slipping photoresist spacer tend to scratch an alignment film in a manual operation process.

BRIEF DESCRIPTION OF THE DRAWINGS

FIG. 2 (b) is a structural sectional view along line a-a' of FIG. 2(a) of a TFT array substrate according to an embodiment of the disclosure;

FIG. 6 (b) is a schematic diagram of voltage polarities of pixel elements with applied signals of odd columns of data lines in the same frame according to an embodiment of the disclosure;

FIG. 9 (b) is a schematic diagram of voltage polarities of pixel elements with applied signals to respective data signals when odd levels of gate lines are turned on in the same frame according to an embodiment of the disclosure;

FIG. 12 (b) is a schematic diagram of voltage polarities of pixel elements with applied signals to respective data signals when odd levels of gate lines are turned on in the same frame according to an embodiment of the disclosure;

FIG. 15 (b) is a schematic diagram of voltage polarities of pixel elements with applied signals to respective data signals when odd levels of gate lines are turned on in the same frame according to an embodiment of the disclosure;

DETAILED DESCRIPTION

The present disclosure relates to the field of display technologies and particularly to a thin film transistor array substrate, a display panel and a display device.

In order to make the objects, the technical solutions and advantages of the disclosure more clear, the disclosure will be described in further details with reference to the drawings. Apparently the described embodiments are only a part but not all of the embodiments of the disclosure. Based upon the embodiments of the disclosure, all of other embodiments derived by those ordinarily skilled in the art without any inventive effort shall come into the scope of the disclosure.

Figure 1:
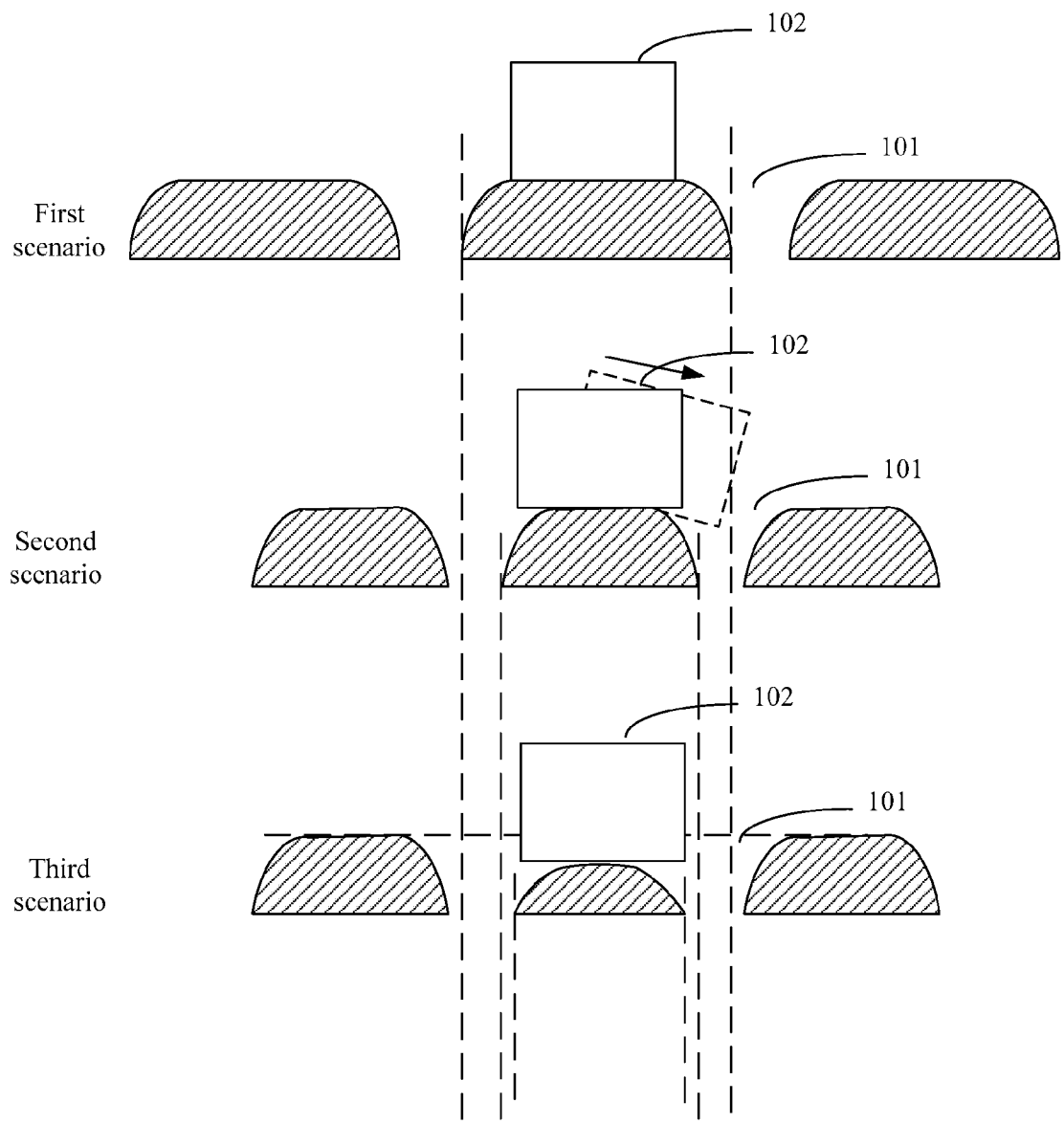
FIG. 1 is a partial sectional view of a TFT array substrate in the related technology.

In order to improve the density of display pixels of the LCD while decreasing the size of respective pixel elements, the original size of the vias has to be maintained due to a process restriction, as illustrated in a second scenario in FIG. 1. At this time there is a shorter distance between the adjacent vias 101, so the vias may be formed through etching while there may be an arc occurring at the locations where the spacers 102 are positioned, and the spacers 102 can not come into full contact with the lower substrate; and the spacers tend to slip into the vias in the case that the upper substrate and the lower substrate bonded in alignment are displaced, in this way lowering the cell thickness at the locations where the spacers 102 are positioned; and moreover the slipping spacer 102 tend to scratch an alignment film in a manual operation process. In addition to the second scenario in FIG. 1, the shorter distance between the adjacent vias 101 may be adverse to exposure of the vias, as illustrated in a third scenario in FIG. 1, in this way lowering the thickness of the planarization layer and consequently degrading the uniformity of the cell thickness throughout the panel. In view of the foregoing problem, it is typical in the related technology to ensure the flatness at the support locations where the spacers 102 are positioned by lowering the sizes of the vias, but the vias of a too small size may fail to be exposed due to a limited process capacity, in this way resulting in abnormal connection of a pixel electrode with a drain in the underlying TFT array and consequently in a dark point and other poor phenomena.

In order to address the foregoing problems, embodiments of the disclosure particularly propose a TFT array substrate, and the inventive solutions will be described below in details in connection with particular embodiments thereof, but the disclosure can be in others as well.

Figure 2:
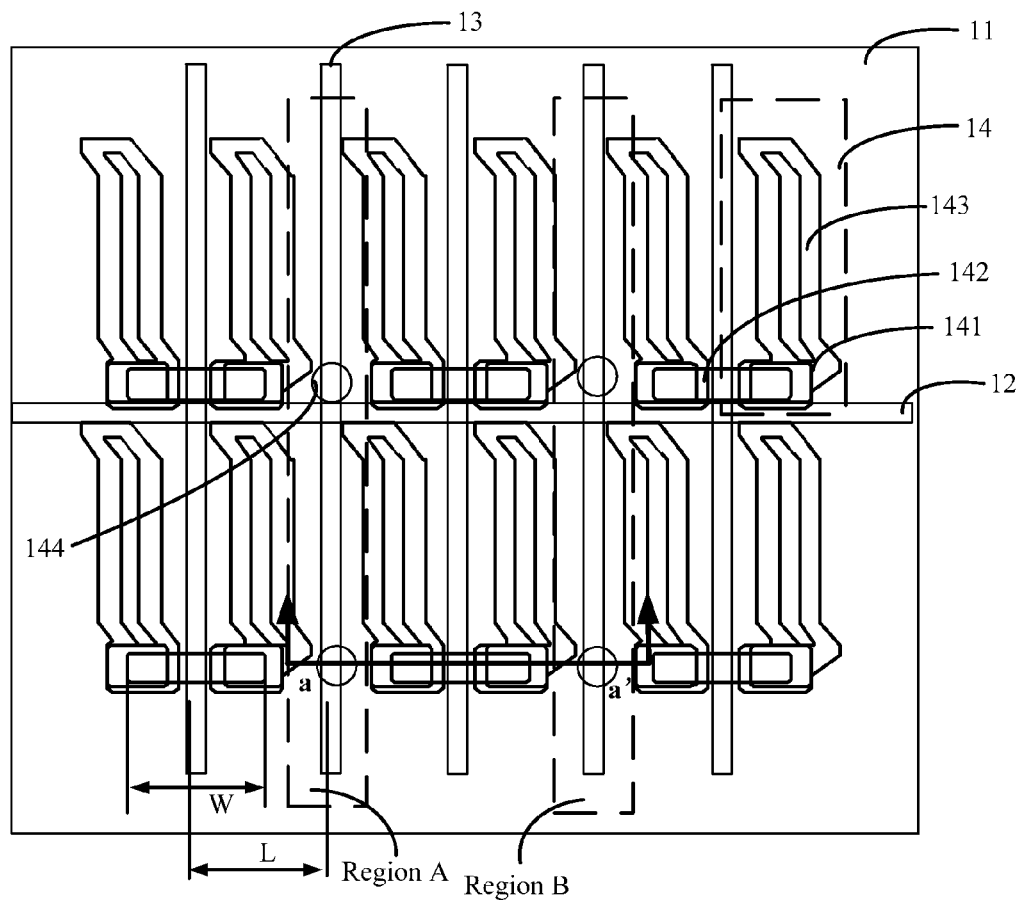
FIG. 2 (a) is a schematic structural diagram of a TFT array substrate according to an embodiment of the disclosure.
Figure 2:
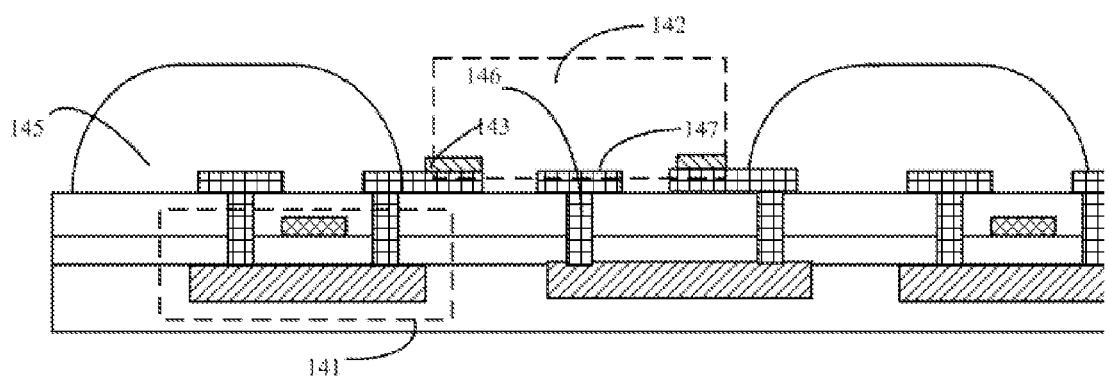

As illustrated in FIG. 2 (a) and FIG. 2 (b), there is a schematic structural diagram of a TFT array substrate according to an embodiment of the disclosure, which includes: a substrate 11; a plurality of gate lines 12 and a plurality of data lines 13 arranged on the substrate 11 to intersect with and be insulated from each other; and a plurality of pixel elements 14 arranged in areas defined by the gate lines 12 and the data lines 13.

At least one of the pixel elements 14 includes: a switch element 141 located on the side of the pixel element proximate to the gate line 12; an insulation layer 145 (or a planarization layer or the like) located above the switch element 141 with vias 142 being arranged in the insulation layer 145; and a pixel electrode 143 located on the insulation layer at the via 142 to be electrically connected with the switch element 141 through a drain or a source 147 of the switch element 141 at the via hole 146, where one of the vias 142 is shared by two transversely adjacent pixel elements 14. A source or a drain of a switch element or a thin film transistor can be interchanged in the following embodiments, and the disclosure can be in others as well.

It shall be noted that FIG. 2 (b) illustrates a structural sectional view of a pixel in a top-gate structure taken along a-a', but the disclosure can be a top-gate structure or a bottom-gate structure.

In present embodiment, the array substrate further includes: a plurality of spacers 144 located between two adjacent vias 142 in the same row.

It shall be noted that in present embodiment of the disclosure, the direction in which a gate line extends is defined as a row, and the direction in which a data line extends is defined as a column. The "row" or the "column" can be referred to for the sake of a convenient description below.

In present embodiment, the vias 142 and the switch elements 141 in the pixel element 14 are arranged cooperatively, and a via 142 is shared by two adjacent pixel elements 14 in the same row, and the width "W" of the vias 142 in the row direction satisfies: "W"≤2"L"−15 μm, where "L" represents the width of a pixel element in the direction in which a gate line extends.

As to the size of vias, the size of vias shall not be too small as mentioned in the related technology. The exposure of the vias will approach a process bottleneck at the width W<4.5 μm of the vias in the row direction so that the vias cannot be exposed. However, in order to achieve a sufficient large spacing between two adjacent vias, the width "W" of the vias in the row direction shall not be too large, either. In the present embodiment of the disclosure, a spacing d>15 μm between the vias and a width W≤(2L−15) μm of the vias in the row direction may be needed for the spacers to be stably positioned at support locations.

Particularly as illustrated in FIG. 2 (a), the locations of the vias 142 are the same in the respective rows arranged between two transversely adjacent pixel elements 14. As can be seen from FIG. 2 (a), a via 142 is not arranged between every adjacent pixel elements 14. Rather, a via 142 is shared by one pixel element 14 and only one of the transversely adjacent pixel elements 14, and a spacer 144 is arranged between the one pixel element 14 and the other one of the transversely adjacent pixel elements 14. Because a via 142 is shared, the array substrate can be prepared simply by controlling the via to approach the region between two adjacent pixel element sharing the via (in a process allowable range) without redundantly adjusting the other film layers, so that pixel electrodes in the respective pixel elements can be ensured to be electrically connected with drain in underlying TFTs through the shared vias although the number of vias is lowered. Sharing vias between the adjacent pixel elements increases the spacing between the adjacent vias by a factor of approximately 50% so as to ensure a sufficient room for the spacers between the adjacent vias to stand, thereby stably supporting the upper substrate and maintaining the uniformity of the cell thickness throughout the display panel.

Based upon the array substrate according to the foregoing embodiment, an embodiment of the disclosure further provides an array substrate which will be described below in details with reference to FIG. 3.

Figure 3:
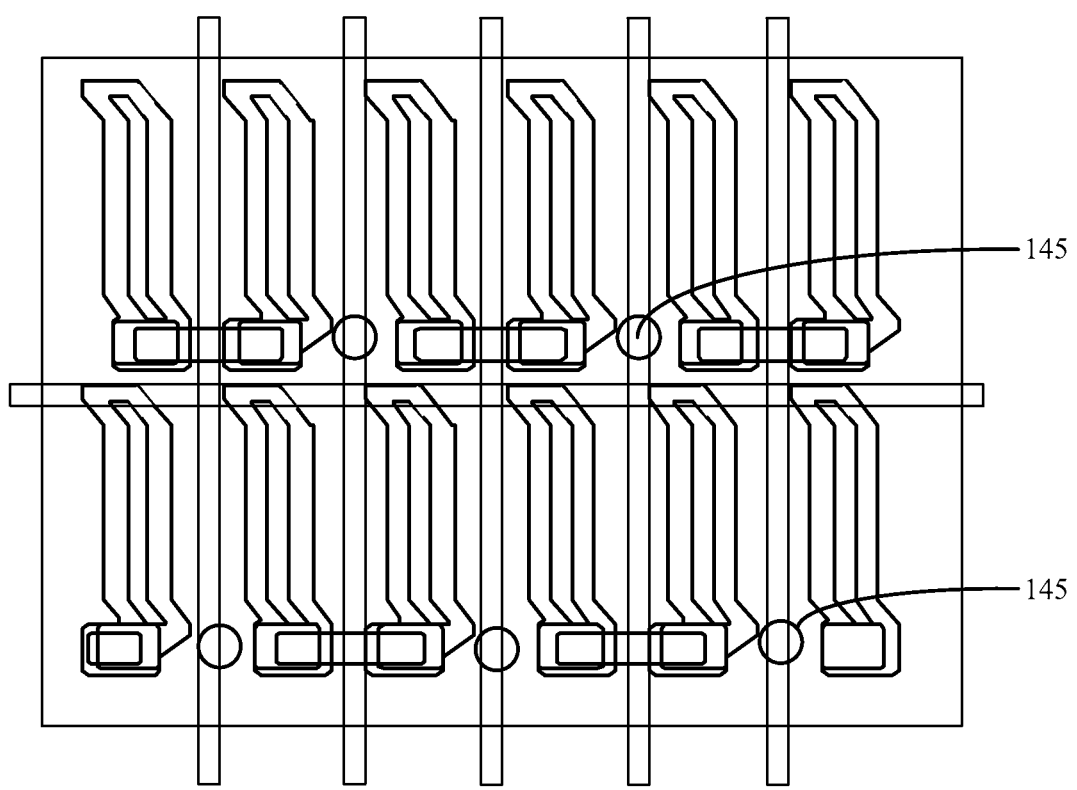
FIG. 3 is a schematic structural diagram of a TFT array substrate according to an embodiment of the disclosure.

FIG. 3 illustrates a TFT array substrate according to an embodiment of the disclosure. The array substrate is substantially the same in structure as the array substrate as illustrated in FIG. 2 (a) except that in this embodiment vias of odd-numbered rows and even-numbered rows are not located in the same column and are staggered. Particularly the vias can be located as described below:

In the M-th row, a via is shared by the pixel element in the N-th column and the pixel element in the adjacent (N+1)-th column; and in the (M+1)-th row, a via is shared by the pixel element in the (N+1)-th column and the pixel element in the adjacent (N+2)-th column, where both M and N are natural numbers.

In present embodiment, the locations of the vias are designed as such because the surface pressure capability of the entire substrate is affected by the density of spacers in the substrate. The more the spacers (the higher the density thereof is), the higher the pressure endurance capacity of the substrate will be. However, when the spacers are arranged between the transversely adjacent vias as in the foregoing embodiment, although the spacers can be distributed evenly, the distribution uniformity of the spacers 145 in the substrate structure is superior as illustrated in FIG. 3. Since the phenomenon of optical leakage may arise from trailing caused by the spacers in frictional orientation, for the structure of the array substrate as illustrated in FIG. 2 (*a*) where a spacer is arranged in every other column of interstices, the effect of the phenomenon of optical leakage will be concentrated in a region A and a region B in which spacers are distributed. For the structure of the array substrate as illustrated in FIG. 3 where a spacer 145 is arranged in every column of interstices, the effect of the phenomenon of optical leakage can be distributed in every column of interstices, so that the phenomenon of optical leakage will not be significant in a display area, thereby improving the display quality in the display area.

In the foregoing embodiments, a via is shared between adjacent pixel elements, thereby avoiding problems in the array substrate with a high pixel density including: non-uniform cell thickness throughout the display panel, insufficient pressure endurance capacity of the display panel, scratched alignment film, etc. Further embodiments of the disclosure further provide other solutions.

Figure 4:
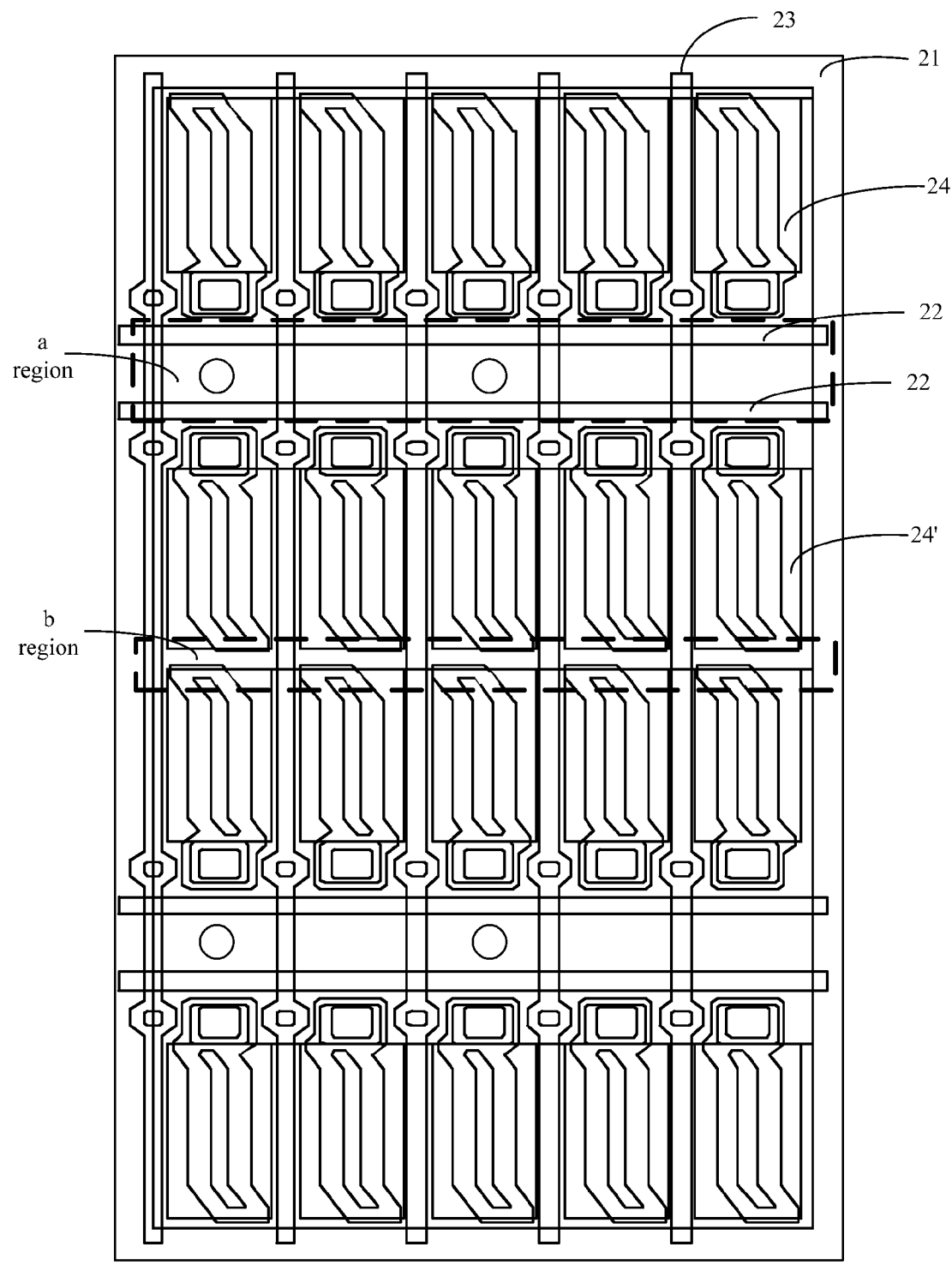
FIG. 4 is a schematic structural diagram of a TFT array substrate according to an embodiment of the disclosure.

FIG. 4 illustrates a TFT array substrate according to a third embodiment of the disclosure.

The array substrate includes a substrate 21; a plurality of gate lines 22 and a plurality of data lines 23 arranged on the substrate 21 to intersect with and be insulated from each other; and a plurality of pixel elements arranged in areas defined by the gate lines 22 and the data lines 23. Unlike the first embodiment and the second embodiment where the pixel elements are of the same type, the plurality of pixel elements in the third embodiment of the disclosure includes a plurality of first pixel elements 24 and a plurality of second pixel elements 24' structured centrally symmetric with respect to the first pixel elements 24. Particularly, the first pixel elements 24 are rotated about a center point leftward or rightward by 180° into the second pixel elements 24'. As illustrated in FIG. 4, any of the pixel elements includes: a switch element, typically a thin film transistor, located on the side of the pixel element proximate to the gate line, including, from the bottom to the top, a gate, a gate insulation layer, an active layer, and a source and a drain insulated from each other; a planarization layer located on the switch element with vias being arranged in the planarization layer, where the vias in FIG. 4 are not structured as the vias in the first and second embodiments, but each pixel element is arranged with a via; and a pixel electrode located on the polarization layer. Due to the polarization layer arranged between the switch element and the pixel electrode, the pixel electrode needs to be electrically connected with the switch element through the via arranged on the polarization layer.

In the structure as illustrated in FIG. 4, the first pixel elements 24 and the second pixel element 24' are arranged in turn in the longitudinal direction in which the data lines 23 are located. Due to such arrangement of pixel elements, among any adjacent first pixel elements 24 and second pixel elements 24' in the longitudinal direction in which the data lines are located, two gate lines are arranged between a first pixel element 24 and a second pixel element 24' adjacent to a switch element, and spacers are arranged between the two gates (in the "a" region in FIG. 4). The "b" region is a region between a first pixel element 24 and a second pixel element 24' adjacent to a pixel electrode.

In the present embodiment of the disclosure, due to the arrangement of pixel elements as illustrated in FIG. 4, there are two gate lines between a first pixel element 24 and a second pixel element 24', wherein the switch elements of the first pixel element 24 and the second pixel element 24' are adjacent to each other. There is some interstice between the two gate lines. Generally, black matrixes are arranged at all the locations where the data lines and the gate lines are positioned to prevent the phenomenon of optical leakage from occurring, and black matrixes are arranged in interstice regions between the two gate lines without any exception. The spacers are arranged between the transversely adjacent vias as illustrated in FIG. 4 in the related technology. Since none of the vias in present embodiment is shared by two transversely adjacent pixel elements, there will be no significant spacing between the transversely adjacent vias. Therefore, it is not appropriate to place spacers between the transversely adjacent vias in the embodiment of the disclosure, and since there are significant interstice regions between the two gate lines, spacers can be placed between the longitudinally adjacent vias, i.e., in the a region, so that there will be a sufficient room for the spacers to stand to ensure the uniformity of the cell thickness throughout the display panel and a sufficient press endurance capacity of the display panel.

In present embodiment, optionally, one of two rows of pixel elements adjacent in the longitudinal direction along the data lines includes only the first pixel elements, and the other row includes only the second pixel elements. The gates of the M-th row of first pixel elements are connected with the M-th level of gate lines, and the gates of the (M+1)-th row of second pixel elements are connected with the (M+1)-th level of gate lines. In the N-th column, the sources or the drains of the switch elements of the first pixel elements are connected with the N-th column of data lines, and the drains of the switch elements of the second pixel elements are connected with the (N+1)-th column of data lines.

Figure 5:
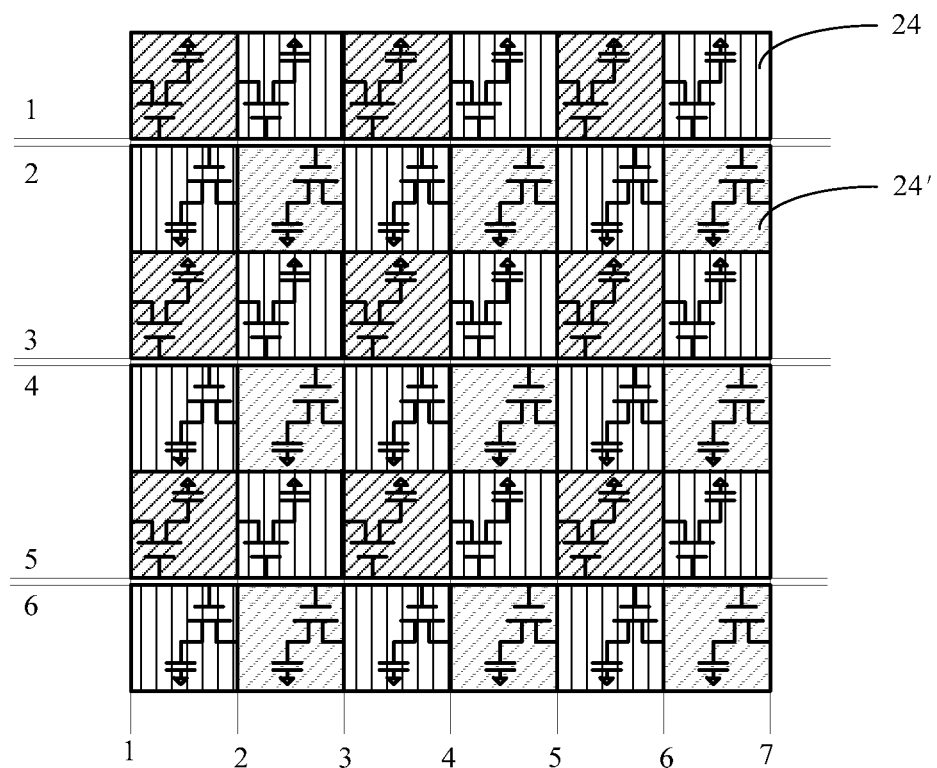
FIG. 5 is a schematic diagram of point inversion for the arrangement of pixel elements according to an embodiment of the disclosure.

With the foregoing solution, the structure of the array substrate as illustrated in FIG. 4 can further be embodied with point-inversion in a column inverted drive mode. FIG. 5 illustrates a schematic diagram of point inversion for the arrangement of pixel elements according to the third embodiment of the disclosure. The pixel elements are structured in the form of a 6×6 matrix. The odd rows (1, 3, 5) include only the first pixel elements 24, and the even rows (2, 4, 6) include only the second pixel elements 24'. Only the connection with the first row and the second row of data lines and gate lines will be described below by way of an example, and the same will apply to the remaining rows.

The gate of each first pixel element 24 in the first row is connected with the first level of gate lines, and in this row, the drain of the first pixel element 24 in the first column is connected with the first column of data lines, the drain of the first pixel element 24 in the second column is connected with the second column of data lines, and so on. The drain of the first pixel element 24 in the sixth column is connected with the sixth column of data lines;

The gate of each second pixel element 24' in the second row is connected with the second level of gate lines, and in this row, the drain of the second pixel element 24' in the first column is connected with the second column of data lines, the drain of the second pixel element 24' in the second column is connected with the third column of data lines, and so on. The drain of the second pixel element 24' in the sixth column is connected with the seventh column of data lines.

Figure 6:
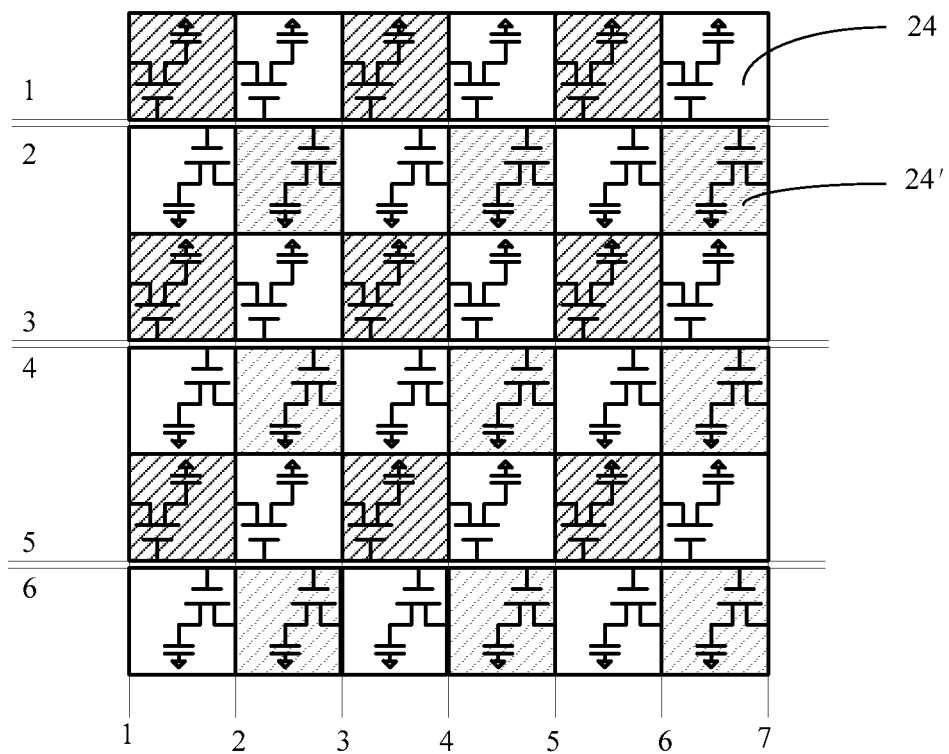
FIG. 6 (a) is a schematic diagram of voltage polarities of pixel elements with applied signals of even columns of data lines in the same frame according to an embodiment of the disclosure.
Figure 6:
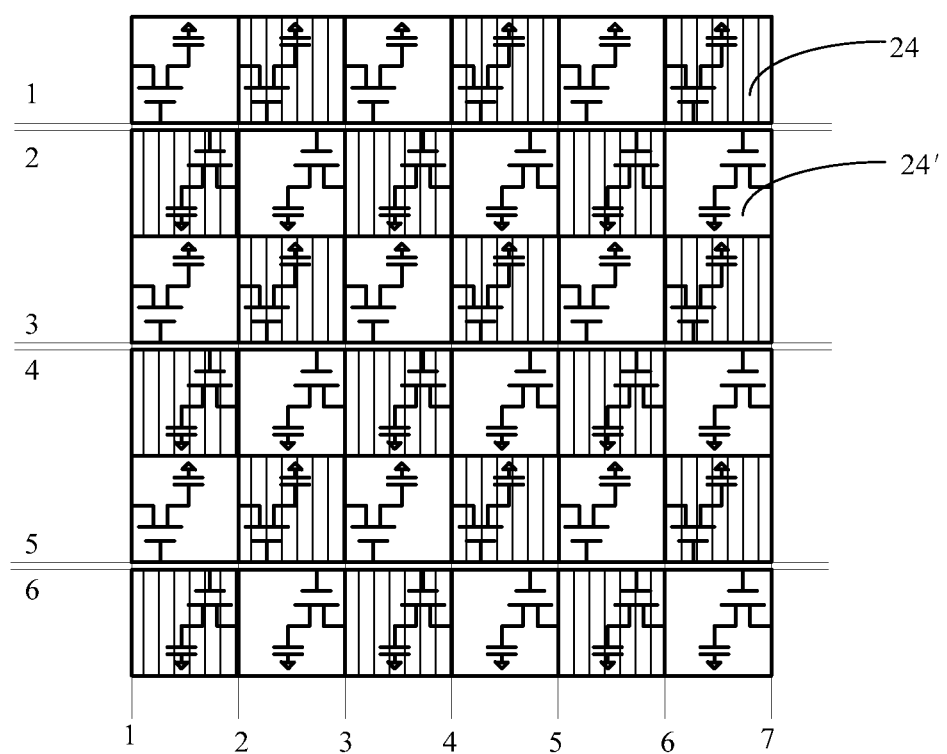

When column inverted data signals are applied to the data lines, operating voltages applied to adjacent data lines are opposite in polarity in a frame, so respective frames can be taken into account separately. FIG. 6 (*a*) illustrates a schematic diagram of voltage polarities of pixel elements with signals applied to even columns of data lines in the same frame, while FIG. 6 (*b*) illustrates a schematic diagram of voltage polarities of pixel elements with signals applied to odd columns of data lines in the same frame. If data signals at backward voltages are applied to the even columns of data lines, and data signals at forward voltages are applied to the odd columns of data lines, then in FIG. 6 (*a*), there are forward operating voltages of the pixel elements connected with the odd columns of data lines, that is, the odd rows (1, 3, 5) and the odd columns (1, 3, 5) of first pixel elements 24 and the even rows (2, 4, 6) and the even columns (2, 4, 6) of second pixel elements 24' are charged, and all of these charged pixel elements are illustrated with their voltage polarities of "+". In FIG. 6 (*a*), there are backward operating voltages of the pixel elements connected with the even columns of data lines, that is, the odd rows (1, 3, 5) and the even columns (2, 4, 6) of first pixel elements 24 and the even rows (2, 4, 6) and the odd rows (1, 3, 5) of second pixel elements 24' are charged, and all of these charged pixel elements are illustrated with their voltage polarities of "−".

It shall be noted that "/" represents the voltage polarity of "+" and "|" represents the voltage polarity of "−" in the draws of the embodiment of the disclosure for the sake of a convenient description.

Point inverted drive as illustrated in FIG. 5 can be performed by applying data signals concurrently to the data lines in the odd columns and the even columns, i.e., inverted drive in a column inverted mode.

In summary for the foregoing third embodiment, the arrangement of pixel elements is adjusted in a way that a row includes only the first pixel elements and a longitudinally adjacent row includes only the second pixel elements, so that there are significant interstice regions between two gate lines for the spacers to be well placed so as to avoid the problem of unstably standing and easily slipping spacers between vias designed in the related technology, ensuring the uniformity of the cell thickness and a good pressure endurance capacity of the display panel. Also, the connection between the pixel elements and the data lines and between the pixel element and the gate lines can be adjusted based upon the arrangement of pixel elements to achieve point-inversion by column inversion, thereby improving a display effect of the array substrate.

Based upon the structure of the array substrate according to the foregoing third embodiment, the pixel elements in the third embodiment are adjusted in the direction of the data lines according to this fourth embodiment so that the pixel elements in the odd columns can be displaced from the pixel element in the even columns while preserving interstice regions between two gate lines in the third embodiment so that there is a sufficient room for the spacers to stand so as to ensure the uniformity of the cell thickness and a good pressure endurance capacity of the display panel. This will be described below in details with connection a particular embodiment thereof.

In present embodiment, optionally, the first pixel elements and the second pixel elements are arranged alternatively in the direction in which the gate lines are located.

Figure 7:
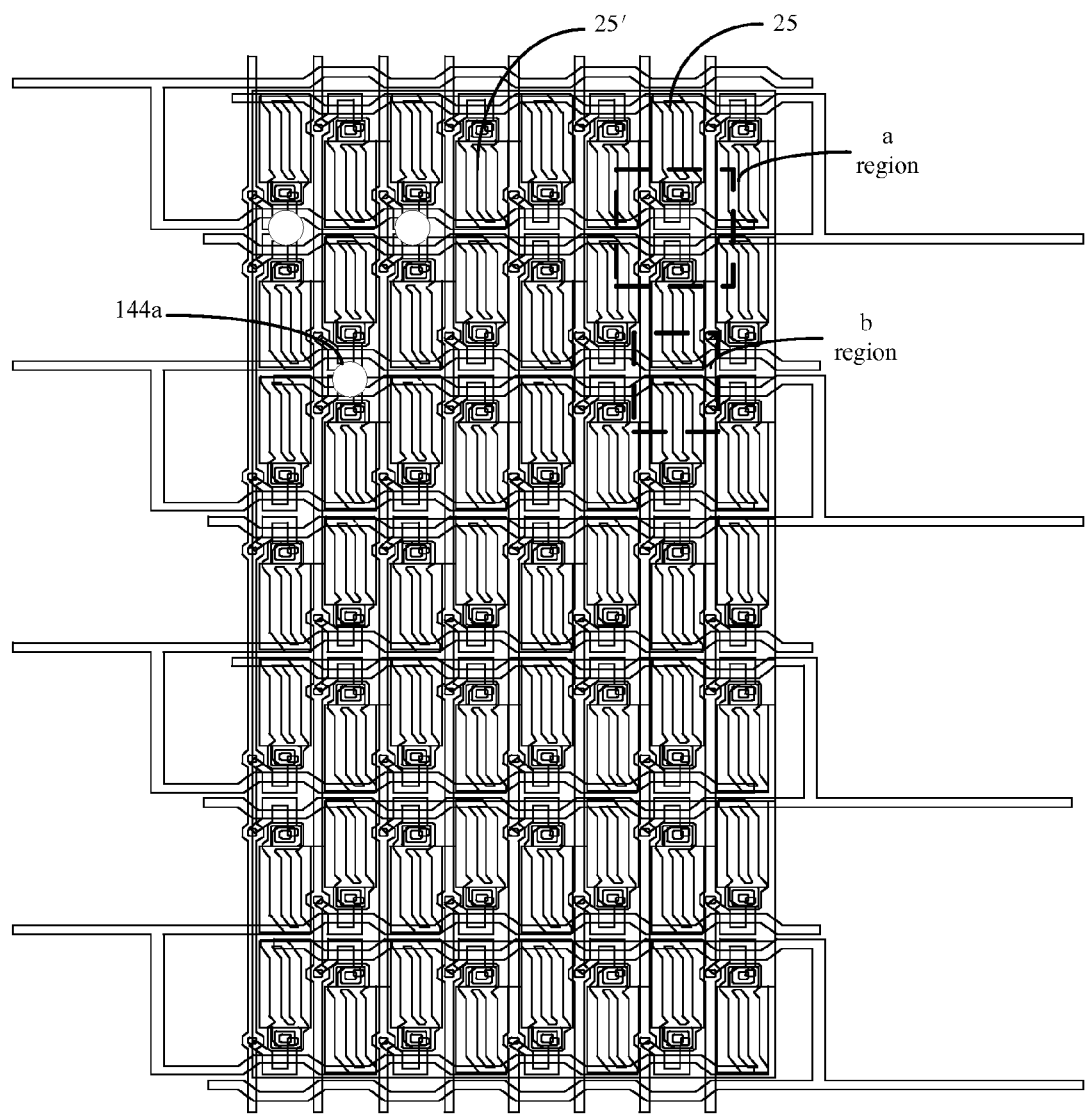
FIG. 7 is a schematic structural diagram of a TFT array substrate according to an embodiment of the disclosure.

In the structure of the array substrate as illustrated in FIG. 7, the first pixel elements 25 and the second pixel elements 25' in each row are arranged alternatively, and the first pixel elements 25 and the second pixel elements 25' in each column are also arranged alternatively. Each gate line is arranged zigzagged periodically in the direction in which the gate line extends transversely, so there are also interstice regions (the a region) at an interval between two adjacent gate lines in each row and each column for the spacers 144*a* to be placed. Moreover, there are discrete interstice regions (where the spacers are placed) between two adjacent gate lines, so black matrixes can be avoided from being arranged in a large area, and the black matrixes can be distributed at a low density to improve the uniformity of display. Additionally, the b region is a region between a first pixel element 25 and a second pixel element 25' adjacent to a pixel electrode.

In present embodiment, optionally, in the array substrate, the (2M+1)-th level of gate lines are connected with all of the gates of the (2M+1)-th row of first pixel elements and the (2M+2)-th row of first pixel elements, and the (2M+2)-th level of gate lines are connected with all of the gates of the (2M+2)-th row of second pixel elements and the (2M+3)-th row of second pixel elements, where M is a natural number. In the N-th column, all of the drains of the switch elements of the first pixel elements and the drains of the switch elements of the second pixel elements are connected with the N-th column of data lines for the purpose of column inversion in column inverted drive.

Figure 8:
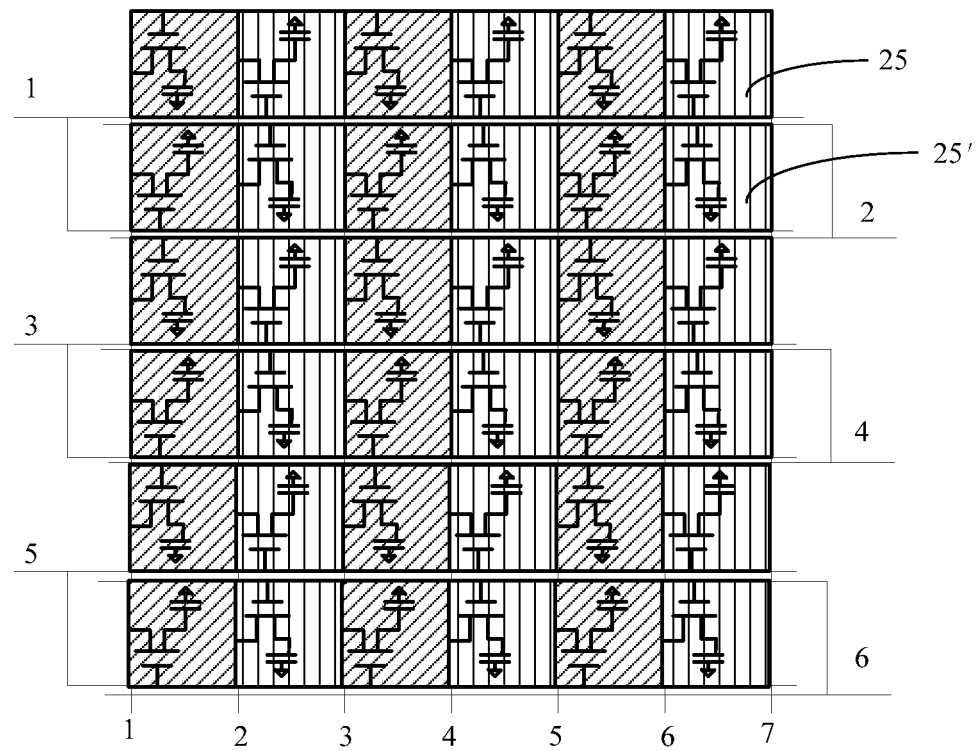
FIG. 8 is a schematic diagram of column inversion for the arrangement of pixel elements according to an embodiment of the disclosure.

With the foregoing solution, the structure of the array substrate as illustrated in FIG. 7 shall be further embodied together with a special drive mode for the purpose of column inversion. FIG. 8 illustrates a schematic diagram of column inversion for the arrangement of pixel elements according to the fourth embodiment of the disclosure. The first pixel elements 25 and the second pixel element 25' in each row are arranged alternatively, and the first pixel elements 25 and the second pixel element 25' in each column are arranged alternatively. Only the connection with the first row to the fourth row of data lines and gate lines will be described below with reference to FIG. 8 by way of an example, and the same will apply to the remaining rows.

The first level of gate lines are connected with all the gates of the first row of first pixel elements 25 and the gates of the second row of first pixel elements 25; the second level of gate lines are connected with all the gates of the second row of second pixel elements 25' and the gates of the third row of second pixel elements 25'; the third level of gate lines are connected with all the gates of the third row of first pixel elements 25 and the gates of the fourth row of first pixel elements 25; and the fourth level of gate lines are connected with all the gates of the fourth row of second pixel elements 25' and the gates of the fifth row of second pixel elements 25'.

All the drains of the first column of first pixel elements 25 and second pixel elements 25' are connected with the first column of data lines, all the drains of the second column of first pixel elements 25 and second pixel elements 25' are connected with the second column of data lines, and so on. All the drains of the sixth column of first pixel elements 25 and second pixel elements 25' are connected with the sixth column of data lines.

Figure 9:
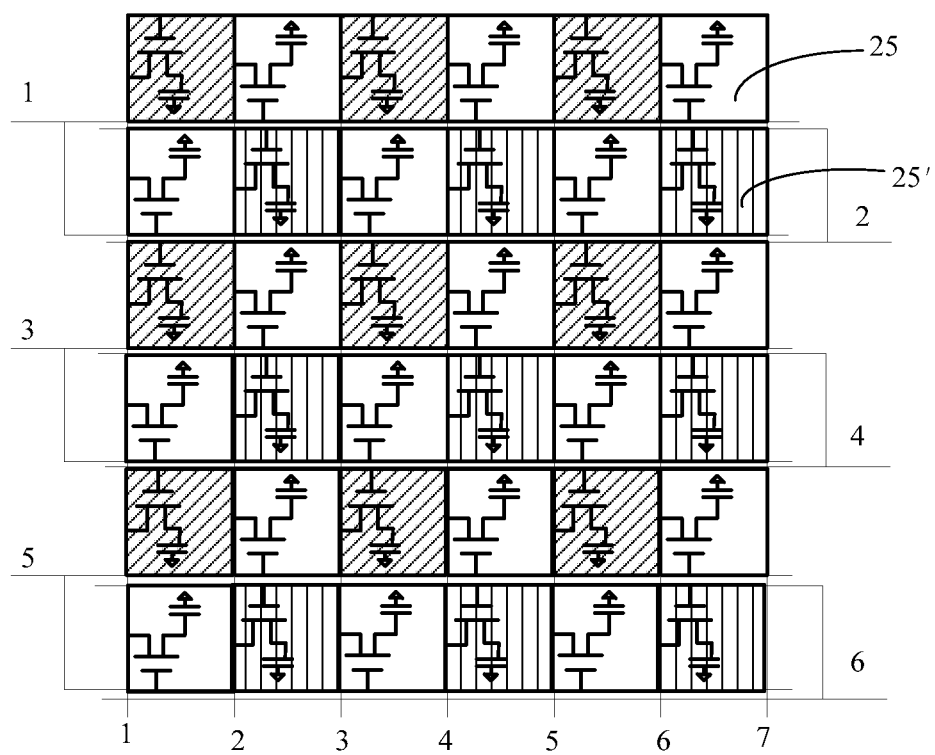
FIG. 9 (a) is a schematic diagram of voltage polarities of pixel elements with applied signals to respective data signals when even levels of gate lines are turned on in the same frame according to an embodiment of the disclosure.
Figure 9:
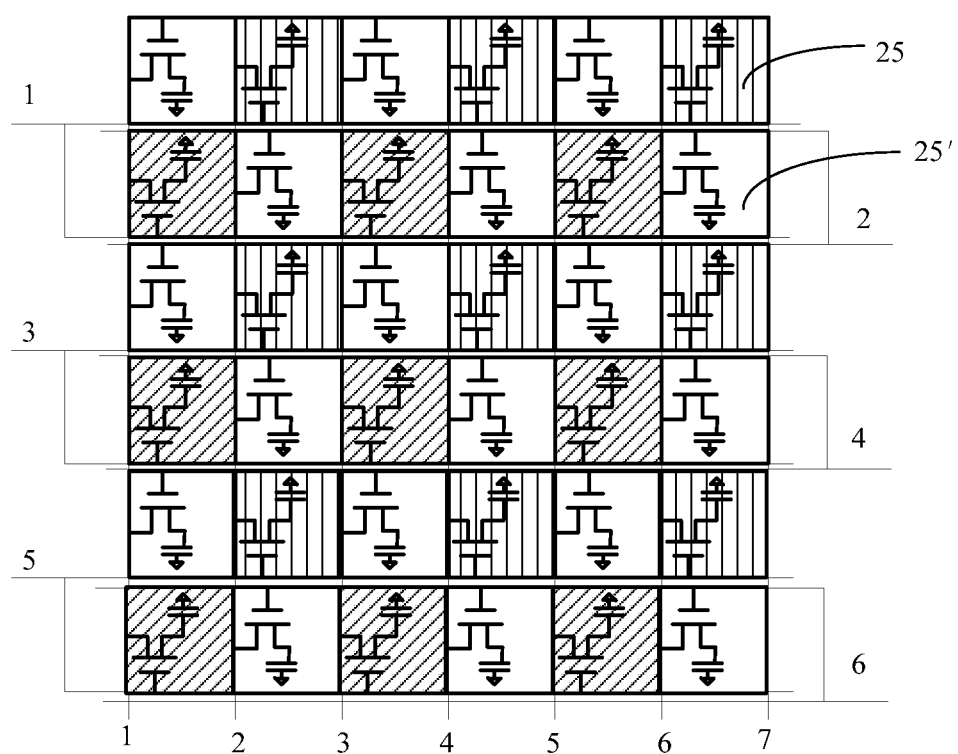

When column inverted data signals are applied to the data lines, operating voltages applied to adjacent data lines are opposite in polarity in a frame, so respective frames can be taken into account separately. FIG. 9 (*a*) illustrates a schematic diagram of voltage polarities of pixel elements with applied signals to respective data signals when even levels of gate lines are enabled in the same frame, while FIG. 9 (*b*) a schematic diagram of voltage polarities of pixel elements with applied signals to respective data signals when odd levels of gate lines are enabled in the same frame. If data signals at backward voltages are applied to the even columns of data lines, and data signals at forward voltages are applied to the odd columns of data lines, then in FIG. 9 (*a*), only the even levels of gate lines are enabled, so forward voltages are applied to only the odd rows (1, 3, 5) and the odd columns (1, 3, 5) of second pixel elements 25', and backward voltages are applied to only the even rows (2, 4, 6) and the even columns (2, 4, 6) of second pixel elements 25'; and in FIG. 9 (*b*), the odd levels of gate lines are enabled, so backward voltages are applied to only the odd rows (1, 3, 5) and the even columns (2, 4, 6) of first pixel elements 25, and forward voltages are applied to only the even rows (2, 4, 6) and the odd columns (1, 3, 5) of first pixel elements 25.

With both the odd levels and the even levels of gate lines are enabled, column inverted drive as illustrated in FIG. 8 can be performed in the foregoing special drive connection mode.

In summary, the arrangement of pixel elements in the third embodiment is further adjusted in the fourth embodiment so that there are still significant interstice regions between two gate lines for the spacers to be well placed so as to avoid the problem of unstably standing and easily slipping spacers between vias designed in the related technology, ensuring the uniformity of the cell thickness and a good pressure endurance capacity of the display panel. Moreover, there are alternating interstice regions between two adjacent gate lines so that black matrixes are distributed at a low density to thereby alleviate the phenomenon of black strips in the interstice regions between two adjacent gate lines. Also, the connection of the respective pixel elements with the data lines and the gate lines is rearranged and adjusted based upon the foregoing arrangement of pixel elements to thereby perform column inversion in present embodiment in the existing column inverted drive mode.

In present embodiment, optionally, among the longitudinally adjacent first pixel elements and second pixel elements, the switch elements of the first pixel elements are connected with the N-th column of data lines, and the switch elements of the second pixel elements are connected with the (N+1)-th column of data lines to thereby perform row inversion in column inverted drive.

Figure 10:
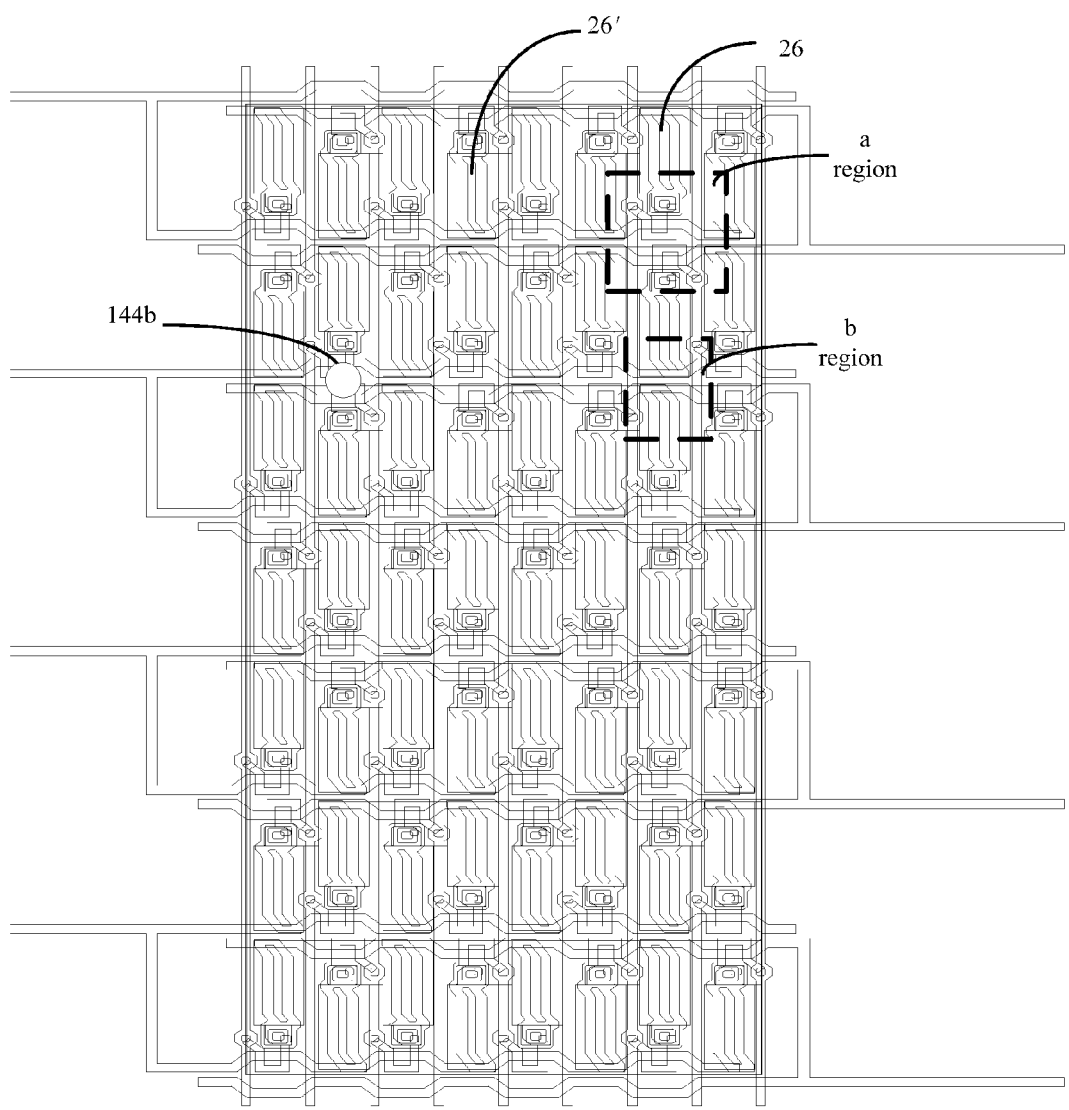
FIG. 10 is a schematic structural diagram of a TFT array substrate according to an embodiment of the disclosure.

FIG. 10 illustrate a schematic structural diagram of an array substrate according to a fifth embodiment of the disclosure. The array substrate is substantially similar in structure to the fourth embodiment in that the first pixel elements 26 and the second pixel elements 26' in each row are arranged alternatively, and the first pixel elements 26 and the second pixel elements 26' in each column are also arranged alternatively. Each gate line is arranged zigzagged periodically in the direction in which the gate line extends transversely, so there are also interstice regions (the a region) at an interval between two adjacent gate lines in each row and each column for the spacers 144*b* to be placed. Moreover, there are discrete interstice regions (where the spacers are placed) between two adjacent gate lines, so black matrixes can be avoided from being arranged in a large area, so that the black matrixes can be distributed at a low density to improve the uniformity of display. Additionally, the b region is a region between a first pixel element 26 and a second pixel element 26' adjacent to a pixel electrode. A difference from FIG. 7 lies in that the connection of the drains of the respective pixel elements with the data lines is adjusted in this fifth embodiment based upon the structure in the fourth embodiment. The structure of pixel elements in the form of a 6×6 matrix in FIG. 11 will be described below in details.

The connection with each level of gate lines is substantially the same as the solution according to the fourth embodiment, but only the connection with the data lines is adjusted.

In the first column, the drains of the first pixel elements 26 are connected with the first column of data lines, and the drains of the second pixel element 26' are connected with the second column of data lines.

In the second column, the drains of the first pixel elements 26 are connected with the second column of data lines, and the drains of the second pixel element 26' are connected with the third column of data lines.

So until in the sixth column, the drains of the first pixel elements 26 are connected with the sixth column of data lines, and the drains of the second pixel element 26' are connected with the seventh column of data lines.

Figure 12:
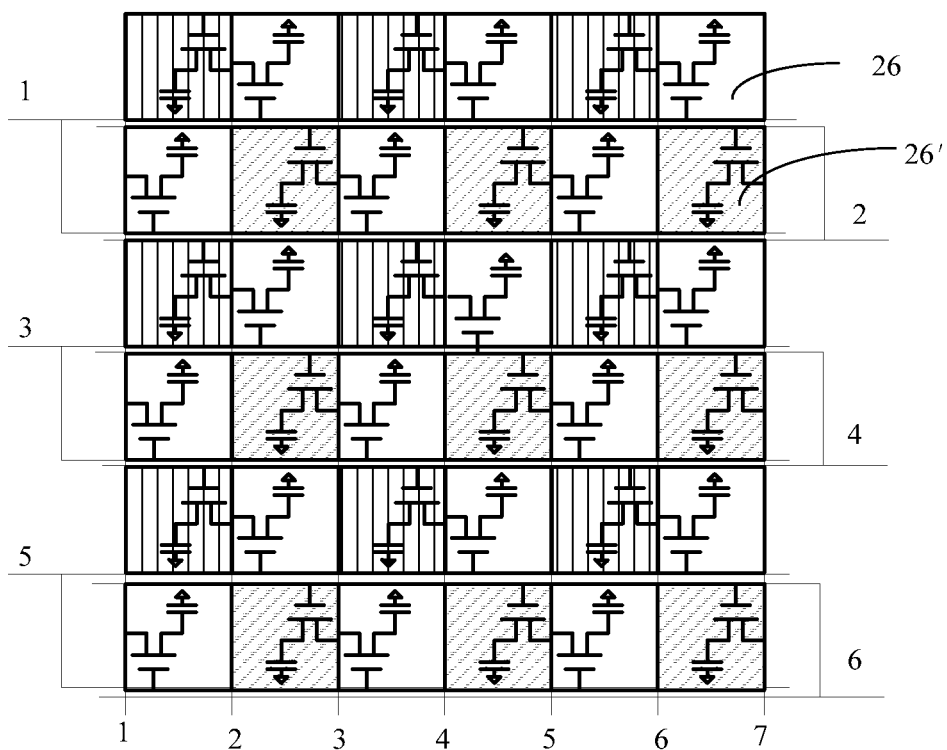
FIG. 12 (a) is a schematic diagram of voltage polarities of pixel elements with applied signals to respective data signals when even levels of gate lines are turned on in the same frame according to an embodiment of the disclosure.
Figure 12:
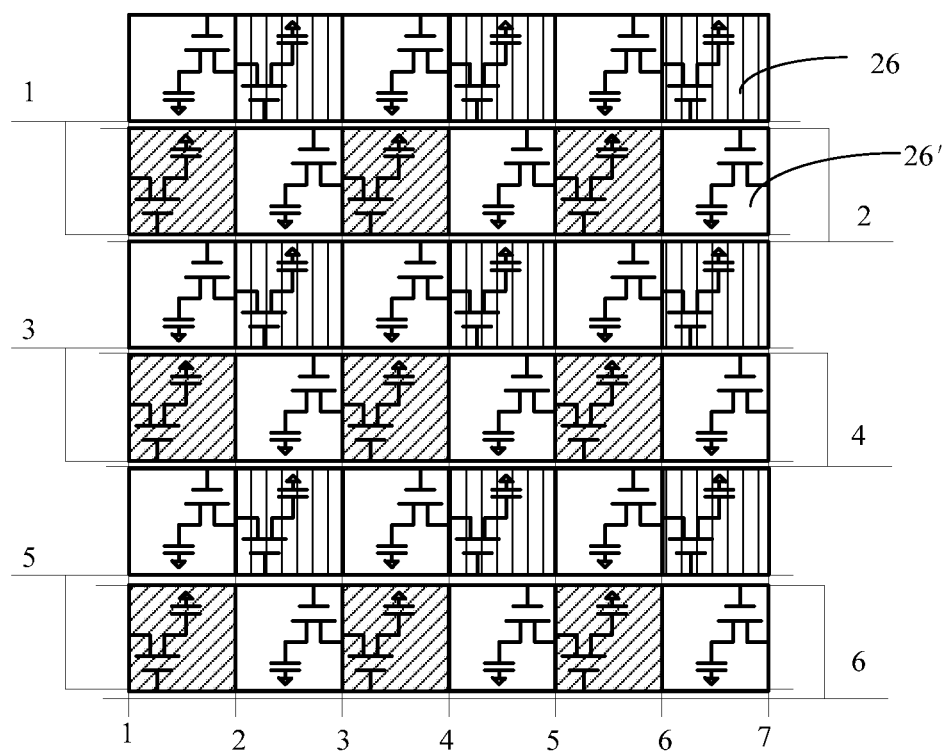

When column inverted data signals are applied to the data lines, operating voltages applied to adjacent data lines are opposite in polarity in a frame, so respective frames can be taken into account separately. FIG. 12 (*a*) illustrates a schematic diagram of voltage polarities of pixel elements with applied signals to respective data signals when even levels of gate lines are enabled in the same frame, while FIG. 12 (*b*) a schematic diagram of voltage polarities of pixel elements with applied signals to respective data signals when odd levels of gate lines are enabled in the same frame. In FIG. 12 (*a*), only the even levels of gate lines are enabled, so backward voltages are applied to only the odd rows (1, 3, 5) and the odd columns (1, 3, 5) of second pixel elements 26', and forward voltages are applied to only the even rows (2, 4, 6) and the even columns (2, 4, 6) of second pixel elements 26'; and in FIG. 12 (*b*), the odd levels of gate lines are enabled, so backward voltages are applied to only the odd rows (1, 3, 5) and the even columns (2, 4, 6) of first pixel elements 26, and forward voltages are applied to only the even rows (2, 4, 6) and the odd columns (1, 3, 5) of first pixel elements 26.

Figure 11:
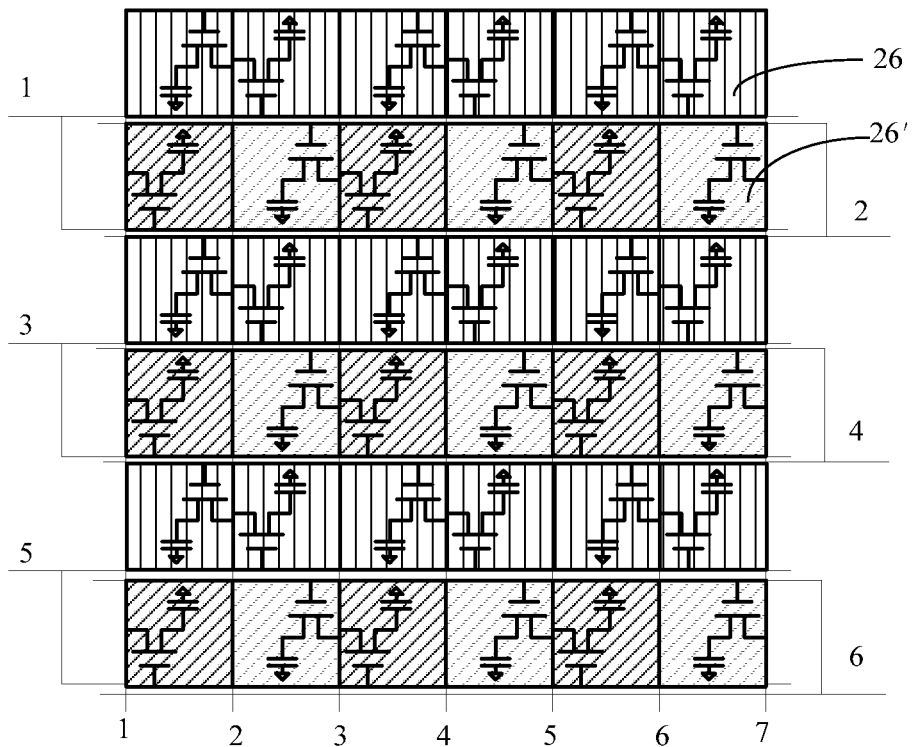
FIG. 11 is a schematic diagram of row inversion for the arrangement of pixel elements according to an embodiment of the disclosure.

With both the odd levels and the even levels of gate lines are enabled, row inversion as illustrated in FIG. 11 can be performed using column inverted drive in the foregoing special drive connection mode.

In summary, the fifth embodiment can achieve the same advantageous effect as the fourth embodiment. Also, the connection of the respective pixel elements with the data lines is rearranged and adjusted based upon the foregoing arrangement of pixel elements to thereby perform row inversion in present embodiment in the existing column inverted drive mode.

In present embodiment, optionally, pairs of first pixel elements consisted of two of the first pixel elements and pairs of second pixel elements consisted of two of the second pixel elements are arranged alternatively in the direction in which the gate lines are located.

Figure 13:
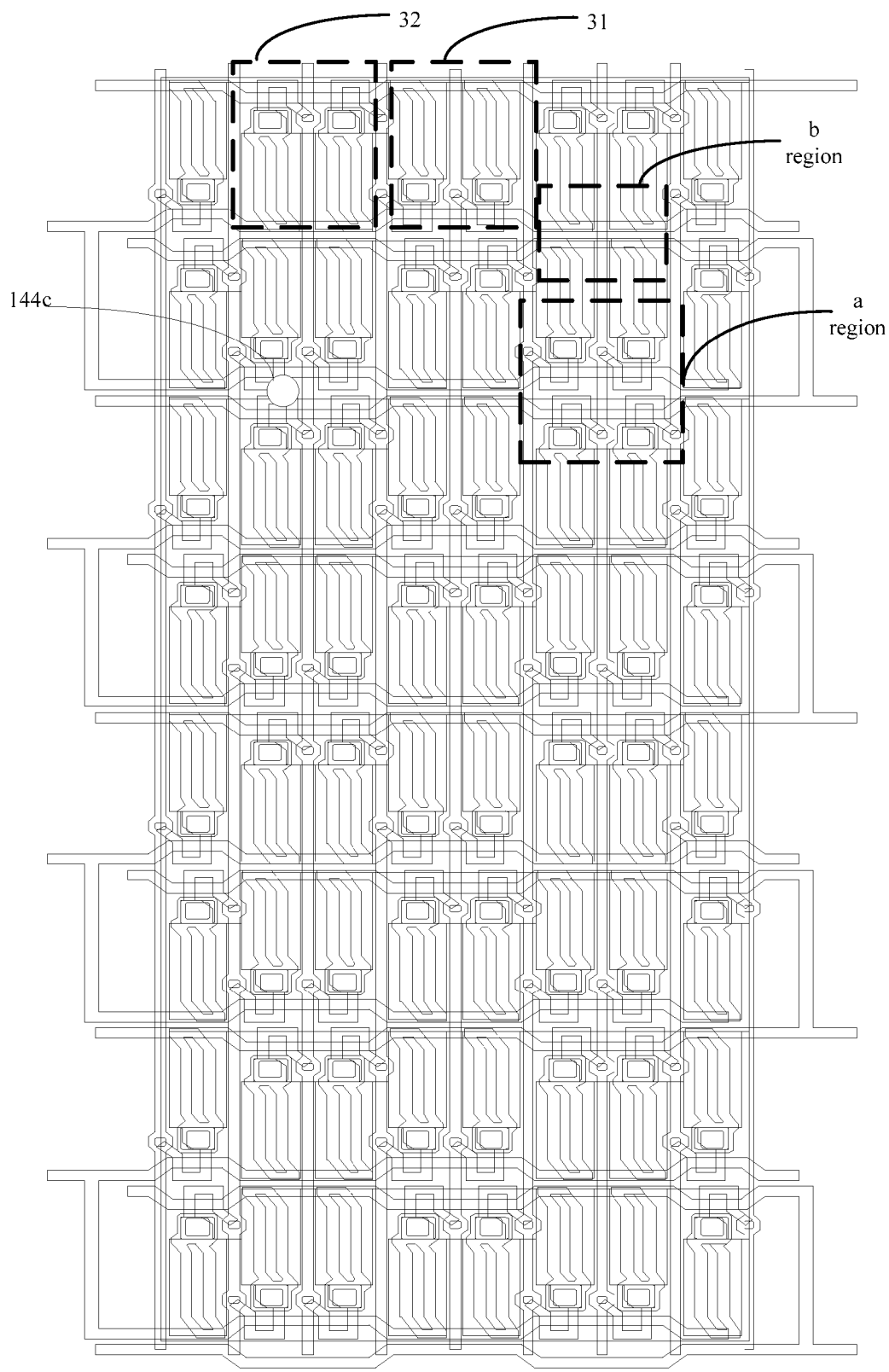
FIG. 13 is a schematic structural diagram of a TFT array substrate according to an embodiment of the disclosure.

FIG. 13 illustrate a schematic structural diagram of an array substrate according to a sixth embodiment of the disclosure. Two adjacent ones of the first pixel elements constitute a pair 31 of first pixel elements, and two adjacent ones of the second pixel elements constitute a pair 32 of second pixel elements; and the pairs 31 of first pixel elements and the pairs 32 of second pixel elements are arranged alternatively in the row direction, and the pair 31 of first pixel elements and the pair 32 of second pixel elements are arranged alternatively in the column direction. In this arrangement of pixels, there are still interstice regions (the a region) between two gate lines in all of the foregoing embodiments so that there is a sufficient room for the spacers 144*c* to stand to ensure the uniformity of the cell thickness and a good press endurance capacity of the display panel. Additionally, the b region is a region between a pair 31 of first pixel elements and a pair 32 of second pixel elements adjacent to a pixel electrode.

In present embodiment, optionally, in the array substrate, the (2M+1)-th level of gate lines are connected with all of the (2M+1)-th row of pairs 31 of first pixel elements and the (2M+2)-th row of pairs 31 of first pixel elements, and the (2M+2)-th level of gate lines are connected with all of the (2M+2)-th row of pairs 32 of second pixel elements and the (2M+3)-th row of pairs 32 of second pixel elements, where M is a natural number. In the N-th column, the switch elements of the first pixel elements are connected respectively with the N-th column of data lines, and the switch elements of the second pixel elements are connected respectively with the (N+1)-th column of data lines for the purpose of two-point inversion in column inverted drive.

Figure 14:
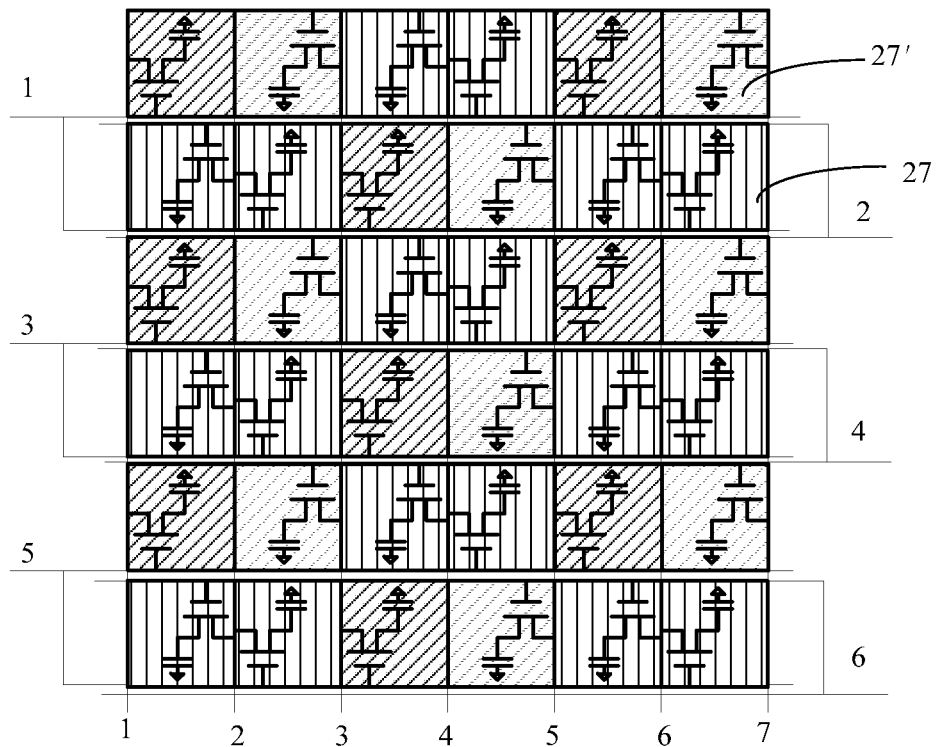
FIG. 14 is a schematic diagram of two-point inversion for the arrangement of pixel elements according to an embodiment of the disclosure.

With the foregoing solution, the structure of the array substrate as illustrated in FIG. 13 shall be further embodied together with a special drive mode for the purpose of two-point inversion. FIG. 14 illustrates a schematic diagram of two-point inversion for the arrangement of pixel elements according to the sixth embodiment of the disclosure. Only the connection with the first row to the fourth row of data lines and gate lines will be described below with reference to FIG. 14 by way of an example, and the same will apply to the remaining rows.

The first level of gate lines are connected with all the gates of the first row of first pixel elements 27 and the gates of the second row of first pixel elements 27; the second level of gate lines are connected with all the gates of the second row of second pixel elements 27' and the gates of the third row of second pixel elements 27'; the third level of gate lines are connected with all the gates of the third row of first pixel elements 27 and the gates of the fourth row of first pixel elements 27; and the fourth level of gate lines are connected with all the gates of the fourth row of second pixel elements 27' and the gates of the fifth row of second pixel elements 27'.

In the first column, the drains of the first pixel elements 27 are connected with the first column of data lines, and the drains of the second pixel element 27' are connected with the second column of data lines.

In the second column, the drains of the first pixel elements 27 are connected with the second column of data lines, and the drains of the second pixel element 27' are connected with the third column of data lines.

So until in the sixth column, the drains of the first pixel elements 27 are connected with the sixth column of data lines, and the drains of the second pixel element 27' are connected with the seventh column of data lines.

Figure 15:
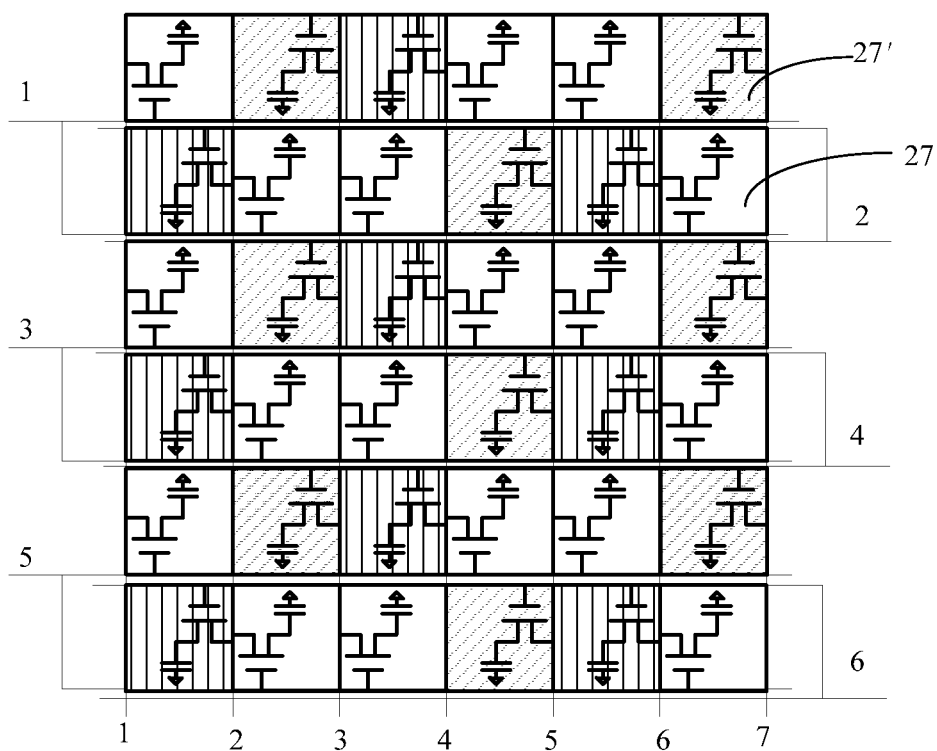
FIG. 15 (a) is a schematic diagram of voltage polarities of pixel elements with applied signals to respective data signals when even levels of gate lines are turned on in the same frame according to an embodiment of the disclosure.
Figure 15:
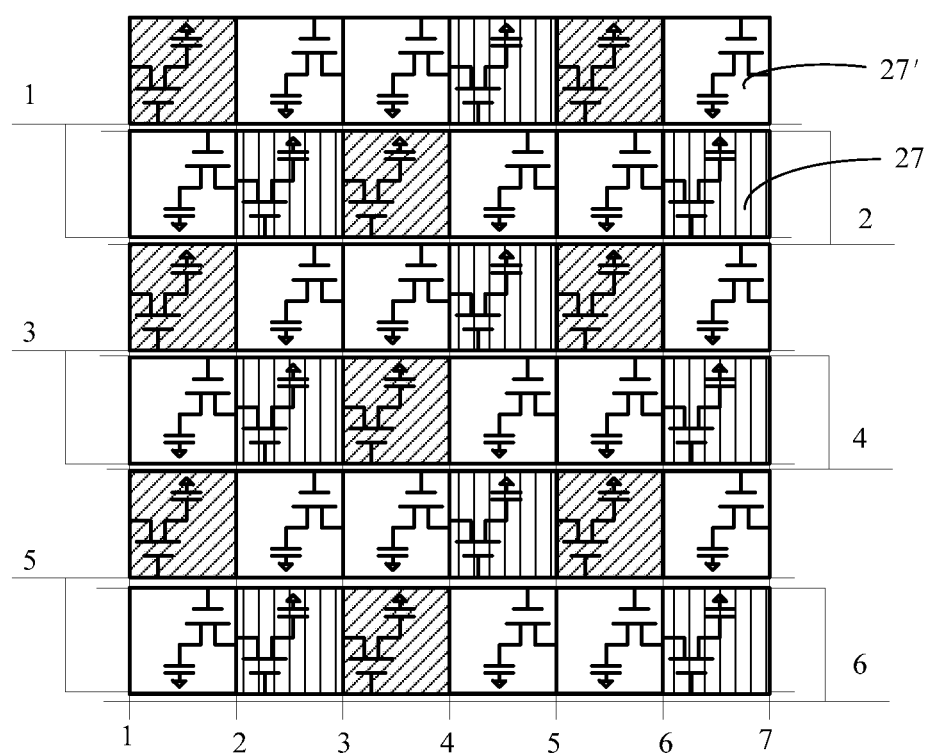

When column inverted data signals are applied to the data lines, operating voltages applied to adjacent data lines are opposite in polarity in a frame, so respective frames can be taken into account separately. If data signals at backward voltages are applied to the even columns of data lines, and data signals at forward voltages are applied to the odd columns of data lines, then FIG. 15 (*a*) illustrates a schematic diagram of voltage polarities of pixel elements with applied signals to respective data signals when even levels of gate lines are enabled in the same frame, while FIG. 15 (*b*) a schematic diagram of voltage polarities of pixel elements with applied signals to respective data signals when odd levels of gate lines are enabled in the same frame. In FIG. 15 (*a*), the even levels of gate lines are enabled, so only the second pixel elements 27' are charged. Particularly, forward voltages are applied to the even columns (2, 4, 6) of second pixel elements 27', and backward voltages are applied to the odd columns (1, 3, 5) of second pixel elements 27'. In FIG. 15 (*b*), the odd levels of gate lines are enabled, so only the first pixel elements 27 are charged. Particularly, forward voltages are applied to the odd columns (1, 3, 5) of first pixel elements 27, and backward voltages are applied to the even columns (2, 4, 6) of first pixel elements 27.

With both the odd levels and the even levels of gate lines are enabled, two-point inverted drive as illustrated in FIG. 14 can be performed using column inverted drive in the foregoing special drive connection mode.

Figure 16:
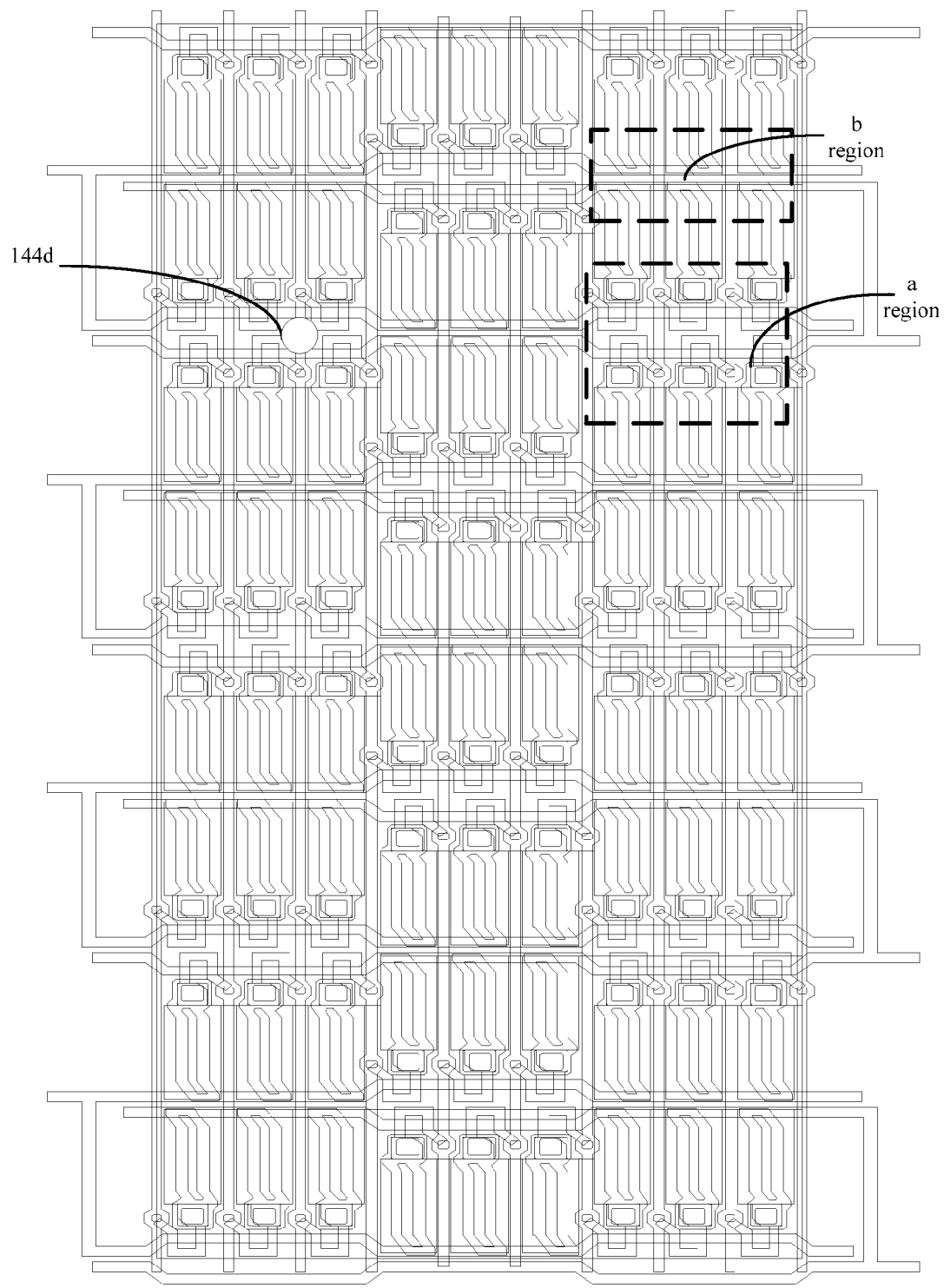
FIG. 16 is a schematic structural diagram of another TFT array substrate for an embodiment of the disclosure.

In present embodiment, optionally, as illustrated in FIG. 16, three or more of the first pixel elements can constitute a group of first pixel elements, and three or more of the second pixel elements can constitute a group of second pixel elements, and the groups of first pixel elements and the groups of second pixel elements, where the number of first pixel elements in each group is the same as the number of second pixel elements in each group, are arranged alternatively respectively in the row direction and the column direction. In this arrangement of pixels, there are still interstice regions (the a region) between two gate lines in all of the foregoing embodiments so that there is a sufficient room for the spacers 144*d* to stand to ensure the uniformity of the cell thickness and a good press endurance capacity of the display panel. Additionally, the b region is a region between a group of first pixel elements and a group of second pixel elements adjacent to a pixel electrode.

Figure 17:
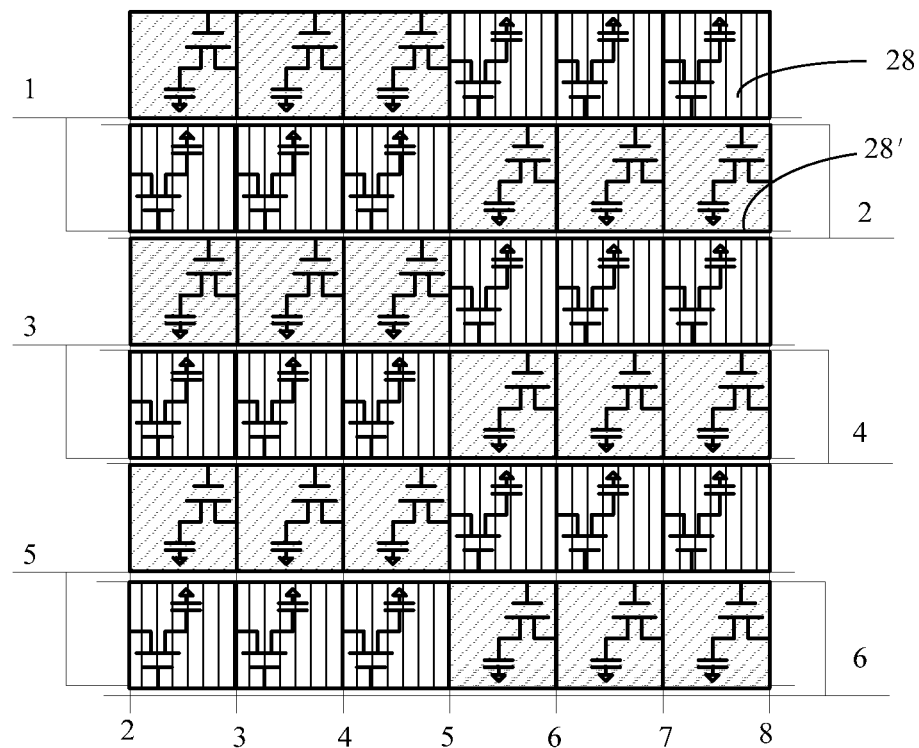
FIG. 17 is a schematic diagram of three-point inversion for the arrangement of pixel elements in the other TFT array substrate for an embodiment of the disclosure.

FIG. 17 illustrates a schematic diagram of three-point inversion for the arrangement of pixel elements according to the embodiment of the disclosure, where three first pixel elements constitute a group 28 of first pixel elements, and three second pixel elements constitute a group 28' of second pixel elements.

The principle of three-point inversion is the same as the principle of two-point inversion in that both of them relate to a drive mode as a result of the connection of the pixel elements to the data lines, and the same can be generalized to multi-point inversion, so a repeated description thereof will be omitted here.

Figure 18:
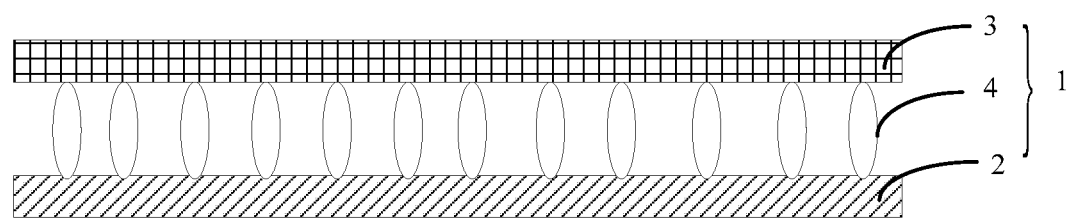
FIG. 18 is a schematic structural sectional view of a display panel according to an embodiment of the disclosure.

There is further provided according to a seventh embodiment of the disclosure a display panel. As illustrated in FIG. 18, the display panel 1 includes the TFT array substrate 2 according to any one of the first embodiment to the sixth embodiment. An active layer in the TFT array substrate includes any one of amorphous silicon, low temperature poly-silicon or oxide. Taking a liquid crystal display as an example, in addition o the TFT array substrate, the liquid crystal display further includes: a color filter substrate 3 arranged opposite to the TFT array substrate, and a liquid crystal layer 4 packaged between the TFT array substrate and the color filter substrate; and optionally, a touch screen integrated on the TFT array substrate or the color filter substrate, etc. Taking an organic light emitting diode display, the display panel further includes a pixel definition layer arranged on the TFT array substrate, an organic light emitting layer, a package layer enclosing the structure, etc.

Figure 19:
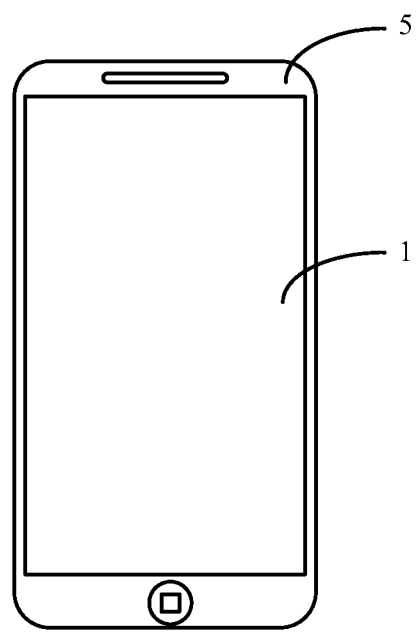
FIG. 19 is a schematic structural sectional view of a display device according to an embodiment of the disclosure.

There is further provided according to an eighth embodiment a display device. As illustrated in FIG. 19, the display device 5 includes the display panel 1 according to the seventh embodiment and further other structural elements in the related technology, e.g., a backlight module, etc.

Although the embodiments of the disclosure have been described, those skilled in the art benefiting from the underlying inventive concept can make additional modifications and variations to these embodiments. In this way the appended claims are intended to be construed as encompassing the embodiments and all the modifications and variations coming into the scope of the disclosure.

Evidently those skilled in the art can make various modifications and variations to the disclosure without departing from the spirit and scope of the disclosure. In this way the disclosure is also intended to encompass these modifications and variations thereto so long as the modifications and variations come into the scope of the claims appended to the disclosure and their equivalents.

The invention claimed is:

1. A thin film transistor array substrate for a display device, the array substrate comprising:
   a substrate;
   a plurality of gate lines disposed on the substrate;
   a plurality of data lines disposed on the substrate, wherein the plurality of the gate lines and the plurality of the data lines intersect with each other to define a plurality of areas and are insulated from each other; and
   a plurality of pixel elements disposed in the plurality of the areas defined by the plurality of the gate lines and the plurality of the data lines, at least one of the pixel elements comprising:
      a switch element;
      an insulation layer located on the switch element; and
      a pixel electrode located at the insulation layer;
         wherein insulation layers of the plurality of the pixel elements define a plurality of vias, the pixel electrodes of two adjacent pixel elements are electrically coupled with the corresponding switch elements of the two adjacent pixel elements through one common via defined by the insulation layers, the two adjacent pixel elements are disposed along extensions of the plurality of the gate lines;
   the plurality of the vias each define a width dimension W along the extensions of the plurality of the gate lines, the plurality of the pixel elements each define a width dimension L along the extensions of the plurality of the gate lines, and W≤2L−15 μm; and
   the plurality of pixel elements define a plurality of rows of the pixels elements arranged along the extensions of the plurality of the gate lines and a plurality of columns of the pixel elements arranged along extensions of the plurality of the data lines,
   in the M-th row of the plurality of rows of the pixel elements, one of the plurality of the vias is shared by a pixel element in the N-th column and a pixel element in the adjacent (N+1)-th column, M and N are natural numbers; and
   in the (M+1)-th row of the plurality of rows of the pixel elements, one of the plurality of the vias is shared by a pixel element in the (N+1)-th column and a pixel element in the adjacent (N+2)-th column.

2. The array substrate of claim 1, wherein the array substrate further comprises a plurality of spacers each located between two adjacent vias of the plurality of vias along the extensions of the plurality of the gate lines.

3. A display panel, comprising a thin film transistor array substrate, wherein the thin film transistor array substrate comprises:
   a substrate;
   a plurality of gate lines disposed on the substrate;
   a plurality of data lines disposed on the substrate, wherein the plurality of the gate lines and the plurality of the data lines intersect with each other to define a plurality of areas and are insulated from each other; and a plurality of pixel elements arranged in the plurality of the areas defined by the plurality of the gate lines and the plurality of the data lines, at least one of the pixel elements comprising:
      a switch element;
      an insulation layer located on the switch element; and
      a pixel electrode located at the insulation layer;
         wherein insulation layers of the plurality of the pixel elements define a plurality of vias, the pixel electrodes of two adjacent pixel elements are electrically coupled with the corresponding switch elements of the two adjacent pixel elements through one common via defined by the insulation layers, the two adjacent pixel elements are disposed along extensions of the plurality of the gate lines;
   the plurality of the vias each define a width dimension W along the extensions of the plurality of the gate lines, the plurality of the pixel elements each define a width dimension L along the extensions of the plurality of the gate lines, and W≤2L−15 μm; and
   the plurality of pixel elements define a plurality of rows of the pixels elements arranged along the extensions of the plurality of the gate lines and a plurality of columns of the pixel elements arranged along extensions of the plurality of the data lines,
   in the M-th row of the plurality of rows of the pixel elements, one of the plurality of the vias is shared by a pixel element in the N-th column and a pixel element in the adjacent (N+1)-th column, M and N are natural numbers; and
   in the (M+1)-th row of the plurality of rows of the pixel elements, one of the plurality of the vias is shared by a pixel element in the (N+1)-th column and a pixel element in the adjacent (N+2)-th column.

4. The display panel of claim 3, wherein the thin film transistor array substrate further comprises an active layer of one of amorphous silicon or low temperature poly-silicon or oxide.

* * * * *